US005796305A

United States Patent [19]
Sondermeyer

[11] Patent Number: 5,796,305
[45] Date of Patent: Aug. 18, 1998

[54] AMPLIFIER ARRANGEMENTS WITH HIGH DAMPING FACTOR

[75] Inventor: Jack C. Sondermeyer, Meridian, Miss.

[73] Assignee: Peavey Electronics Corporation, Meridian, Mich.

[21] Appl. No.: 663,691

[22] Filed: Jun. 14, 1996

[51] Int. Cl.$^6$ .................................................. H03F 1/34
[52] U.S. Cl. .......................... 330/105; 330/109; 381/121
[58] Field of Search ................................ 330/103, 104, 330/105, 109, 260, 244; 381/96, 120, 121

[56] References Cited

U.S. PATENT DOCUMENTS

| | | | |
|---|---|---|---|
| 3,838,352 | 9/1974 | Dolby et al. | 330/105 |
| 4,042,889 | 8/1977 | Baker | 330/207 P |
| 4,236,118 | 11/1980 | Turner | 330/105 |
| 4,260,954 | 4/1981 | Crooks | 330/85 |
| 4,320,351 | 3/1982 | Brown, Jr. et al. | 330/260 |
| 4,482,866 | 11/1984 | Crooks | 330/109 X |
| 5,197,102 | 3/1993 | Sondermeyer | 381/96 |
| 5,245,296 | 9/1993 | Miller et al. | 330/105 X |
| 5,268,527 | 12/1993 | Waller, Jr. | 84/736 |

*Primary Examiner*—Steven Mottola
*Attorney, Agent, or Firm*—Watson Cole Stevens Davis, P.L.L.C.

[57] ABSTRACT

A circuit for increasing damping factor in an audio amplifier adapted to be coupled to a load by output feed and return leads and components having an impedance causing a reduction in the damping factor, employs a balanced feedback network having first and second inputs and first and second outputs. The first input is coupled to a selected one of the feed and return lead near the output terminal and the second input is coupled to the same lead remote from the output terminal to thereby establish a series impedance between said first and second inputs representative of impedance of the selected output lead. The first output is coupled to the non-inverting input of the amplifier and the second output is coupled to the inverting input of the amplifier. The balanced feedback network positively feeds back a representation of the impedance to compensate therefor and thereby raise the damping factor of the amplifier. In an alternative embodiment, an isolating transformer is employed in the balanced feedback network.

10 Claims, 3 Drawing Sheets

AMPLIFIER ARRANGEMENTS WITH HIGH DAMPING FACTOR

BACKGROUND OF THE INVENTION

This invention pertains to power amplifiers and, in particular, to power amplifiers having high damping factor facilitated by a balanced positive feedback network.

Damping factor is one of several critical specifications used to judge how well or poorly a power amplifier will control any associated loudspeaker connected to it. Generally, most high fidelity (Hi-Fi) power amplifiers have high damping factors. The number itself often becomes a specification to which is attached the feeling, the bigger the better. There are those that can listen and identify high damping factor Hi-Fi amplifiers. On the other hand, a typical guitar amplifier actually reduces (or destroys) the damping factor to make it sound better to musicians.

Damping factor is ratio of the amplifier load impedance to the amplifier output impedance as follows:

$$DF = \frac{\text{Amp Load Impedance}}{\text{Amp Output Impedance}} \quad (1)$$

Damping factor can also be shown as the inverse of the amplifier output regulation, and output regulation is specified in the well known no load (NL) and full load (FL) voltages as follows:

$$DF = \frac{1}{\text{Amp Output Regulation}} \quad (2)$$

$$\text{Amp Output Regulation} = \frac{V(NL) - V(FL)}{V(FL)} \quad (3)$$

Thus, damping factor can be calculated using measured no load and full load voltages as follows:

$$DF = \frac{V(FL)}{V(NL) - V(FL)} \quad (4)$$

Damping factor is a measure of how much control the power amplifier has on the associated loudspeaker. If an amplifier has a high DF (low output impedance), its output voltage level will change very little with the large variations in the loudspeaker impedance with frequency. As such then, this high damping factor value will provide a high degree of "control" over the loudspeaker and the resulting sound is said to be "tight", particularly in the low frequency range near the resonance of the loudspeaker enclosure. Also, any large variations in the loudspeaker impedance over the full frequency range, will not grossly affect the overall frequency response of the system. Although subject to some controversy, a DF of 200 or greater is generally considered adequate to provide a "tight" sound in most typical "woofer" applications.

An amplifier with a lower damping factor (or higher output impedance) will have larger variations of the output voltage with changes in loudspeaker impedance, and thus, will not control the loudspeaker as well. This can be detected by a critical listener, and is often referred to as a "loose" or "floppy" sound. Some critical listeners can hear when the DF drops below 200. Most listeners, however, will not notice much change until the DF drops below 50. In a guitar power amplifier, a DF of "1" is considered optimum. Obviously, to a Hi Fi enthusiast, this would not be so.

DF specifications have been published in the 500 range and in some cases, DFs above 1000 are noted. While this is desirable to the audiophile, in practice, it is very hard to accomplish. It is desirable to increase the damping factor beyond that which is generally considered acceptable, for example, above 2000 by means of a relatively simple and economical technique. It is particularly desirable to transform an amplifier with a DF of 200 into an amplifier having a damping factor of greater than 1000.

SUMMARY OF THE INVENTION

The present invention is based upon the discovery that a high damping factor may be achieved in a power amplifier by means of a balanced positive feedback network for sensing a voltage drop in the load circuit. According to the invention, a voltage drop in the internal output leads remote from the speaker load (i.e. proximate the amplifier) is positively fed back to the amplifier input to compensate for increased output resistance.

DESCRIPTION OF THE INVENTION

Figure 1:
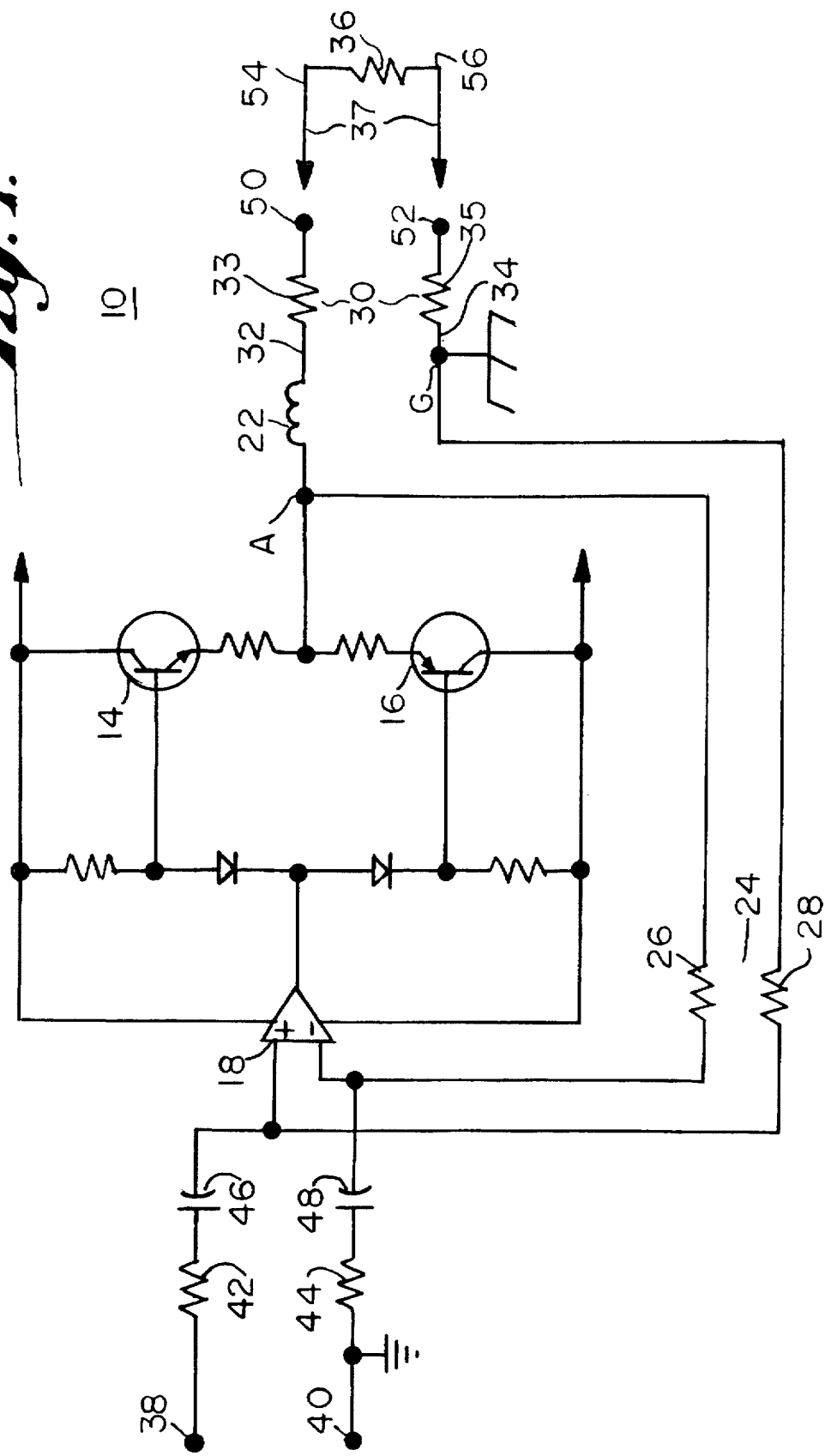
FIG. 1 is a simplified schematic diagram of a complementary NPN/PNP type power amplifier.

FIG. 1 is a simplified schematic diagram of a power amp 10. The power amp 10 includes complementary connected NPN/PNP transistors 14 and 16 biased for Class B operation; an operational amplifier 18 with positive (non-inverted) and negative (inverted) inputs; an output coil 22; a balanced feedback network 24 including resistors 26 and 28; and output wiring 30 including feed wire 32 and return wire 34 each having a corresponding finite resistance 33 and 35. The wiring 30 represents internal output losses of the amplifier 10. A load 36 represents a matched separate impedance coupled to the amplifier by external output wires 37.

The amp 10 has input terminals 38 and 40 with the latter at input ground. A full balanced arrangement is used with input resistors 42 and 44, blocking capacitors 46 and 48, and feedback resistors 26 and 28. Point A represents the internal output of the amplifier and has its signal fed back via resistor 26 to the negative (in-verted) input of opamp 18. Input signals are applied via resistor 42 and capacitor 46 to the positive (non-inverted) input of op-amp 18. The full balanced feedback circuit 24 is used to eliminate hum and noise between input and output. Overall amp gain $$\frac{\text{Resistor 26}}{\text{Resistor 44}}$$

is about 31.33 (i.e., 47,000 divided by 1,500 in the exemplary embodiment) (typical 400 Wrms/4 ohm amp).

Internal point A, proximate the active elements of the amplifier, has a high damping factor (DF) due to feedback. That is, point A is highly regulated, with a low output impedance. In the exemplary embodiment, the DF approaches infinity; because the amplifier output impedance at point A approaches zero. Unfortunately, access to point A is restricted, and consequently, it is not practical to take advantage of the high DF thereat.

Virtually every power amplifier needs an output inductor for stability. In this case, inductor 22 (e.g., 3 microhenrys)

is used. Output inductor 22 functions to isolate capacitive loads that would cause the amplifier to oscillate at very high frequencies. The value of inductor 22 is chosen to be large enough to eliminate stability problems, but not too large to degrade the power amplifier frequency response (typically about 30 KHz or so). Unfortunately, the inductor 22 is not perfect. It has a DC resistance, as does the wiring 30 used to connect point A to the outside world via the output terminals 50 and 52. For example, assume that inductor 22 has a resistance of 0.005 ohms and each wire 32, 34 has a resistance of 0.01 ohms, represented by the resistors 33 and 35, respectively. Consequently, between point A and the 4 ohm load 36 the resistance is at least 0.25 ohms (0.01+0.01+ 0.005). Using Formula (1) to compute the DF, the value is 160 (4 divided by 0.025). This does not consider the resistance of the output wires 37 to the speaker 36. Note the output impedance of the power amp 10 is not zero ohms, but is effectively 0.025 ohms at the output terminals 50 and 52. Thus, it is reasonable to specify a damping factor of 150 to cover component variations, which is adequate for most sound systems.

Many power amplifiers employ a relay (not shown) in the output to eliminate turn on and turn off transients. Unfortunately, most relays have contact and lead resistance which only further reduces the DF. If one uses, for example, #14 AWG output wires 32 and 34 to connect to the output terminals 50, 52 the corresponding wire resistance 33, 35 is reduced to 0.005 ohms. Thus, it is possible to reduce the amplifier output impedance to below 0.02 ohms, which yields a DF of 200. This is a typical DF for conventional power amps. DF may be improved by using larger wire sizes, larger heavy duty relays, and larger wire size coils to produce DF values in excess of 500. These amps are usually more expensive.

It should be clear at this point that the large damping factor numbers only exist at the power amp output terminals. When the speaker is connected to external wiring, the damping factor value is reduced accordingly. This is why Hi-Fi audio stores advertise and sell what is called "monster speaker cable" for relatively high prices. Ten feet of even the most expensive cable adds at the very least 0.02 ohms or more so to the output losses. Thus, even though the user has purchased a power amp with a published DF of 1000, the actual system DF will often never be greater than 200 due to the output cable resistance.

Some power amplifiers employ external sensing wiring capability, where a second pair of wires is run from the power amp to the terminals 54 and 56 of the loudspeaker load 36. In such arrangements, the actual voltage at the loudspeaker 36 is fed back to the amplifier 10 to improve the regulation (i.e., increase the DF) at that point. These approaches are expensive, and impractical for portable sound equipment. Additionally, complex and costly feedback circuitry must be employed to prevent instability.

Figure 2:
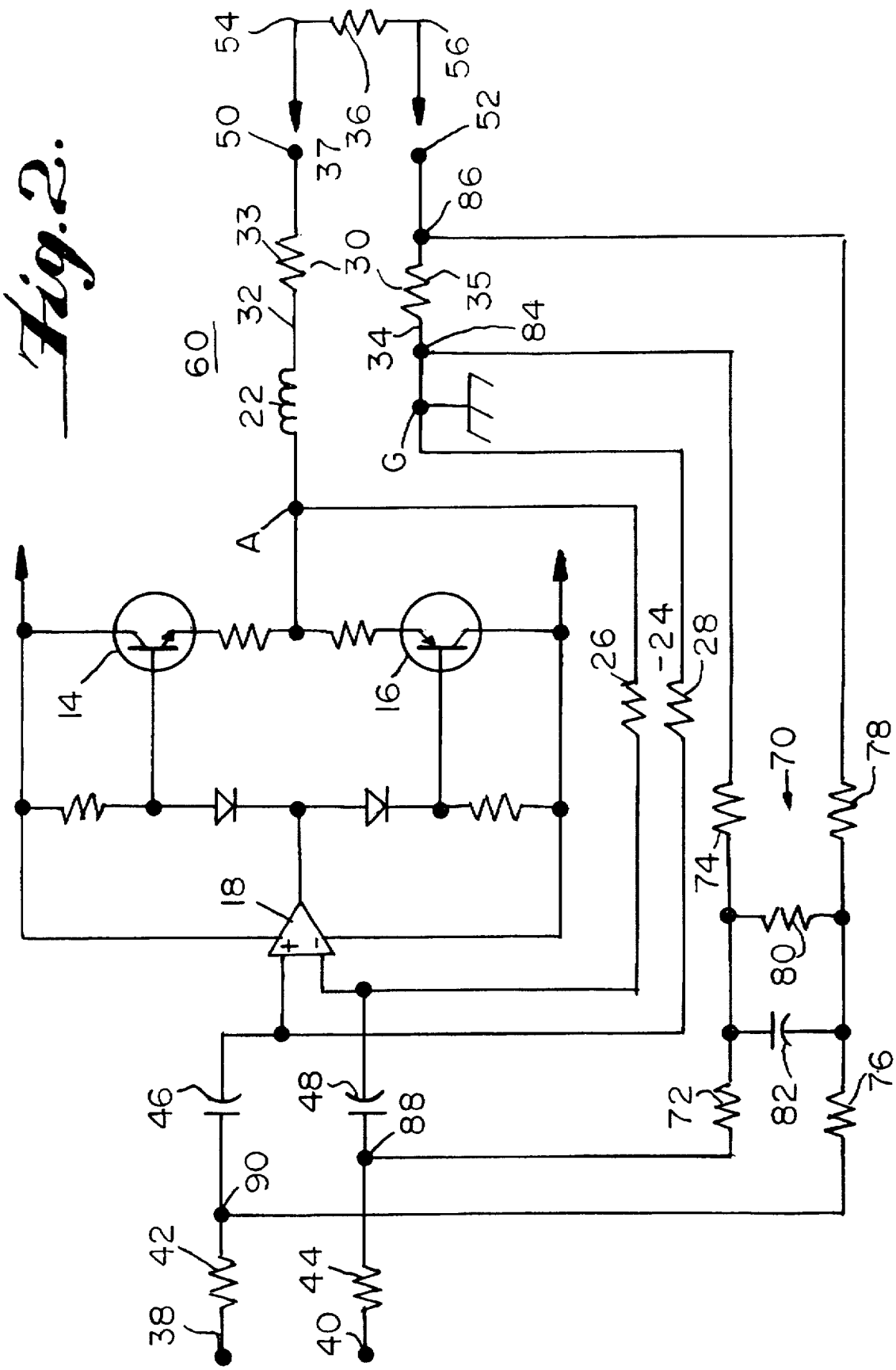
FIG. 2 is a schematic diagram of the power amplifier of FIG. 1 employing the damping factor enhancement in the output return lead according to the present invention.

FIG. 2 shows a simplified schematic of a power amplifier 60 according to the invention having high DF. Similar reference numbers are used where appropriate. According to the invention, a second balanced feedback circuit 70 including resistors 72, 74, 76, 78, 80 and capacitor 82 is employed. The circuit 70 includes first and second inputs 84, 86 and first and second outputs 88, 90. The first input 86 is coupled to the return wire 34 near the output terminal 52. The second input 84 is coupled to the return wire 34 remote from said output terminal 52 near system ground. The arrangement thereby establishes a series impedance between said first and second inputs 84 and 86 representative of impedance of the internal return lead 34. The first output 88 is coupled to the inverting input of the amplifier 18 and the second output 90 is coupled to the non-inverting input of the amplifier 18. The balanced feedback network 70 positively feeds back a representation of the output lead impedance of the amplifier to compensate therefor and to raise the damping factor of the amplifier.

The circuit of the invention is used to sense the voltage drop across the output load return wire 34. One leg is coupled to the power amp internal ground G; the other leg is coupled to output terminal 52. The voltage drop along the return wire 34 is fed back via the balanced network 70 using positive feedback to raise the output voltage slightly at Point A to compensate for the voltage losses in the coil 22 and all the internal output wiring 30. If the Point A voltage is raised, in the exact proportion to the voltage losses, then the regulation at the output terminals 50 and 54 approaches zero value, and the damping factor approaches infinity value.

In an exemplary embodiment, using a 400 Wrms/4 ohm amp, at full power output, 40 Vrms is delivered to the 4 ohm load 36. Since both wiring losses 33, 35 and inductor 22 losses are in series with the 4 ohm load 36, the voltage drop across each wire 32 and 34 is approximately 0.1 Vrms, and the voltage drop (loss) is 0.25 Vrms. In the exemplary embodiment, the voltage gain of the positive feedback network 24 is:

$$\frac{\text{Resistor 26}}{\text{Resistors 72} + 74} \text{ or } \frac{47 \text{ k}\Omega}{6.8 \text{ k}\Omega + 6.8 \text{ k}\Omega} = 3.4$$

Thus, the sensed voltage drop of 0.1 Vrms of the wires 30 is amplified by 3.4 to produce an additional 0.34 Vrms at Point A so that the voltage thereat is increased to 40.34 Vrms. This is more than adequate to compensate for the 0.25 Vrms losses, and in reality, the loss has been overcompensated, amp output impedance and DF are now "negative".

This condition is alleviated, because the loudspeaker 36 will be connected with speaker wire 37 which will present additional losses that will put these values back in the "positive". However, to correct this overcompensated condition, resistor 80, is added reducing the positive feedback network gain value to slightly less than 2.5 to provide the proper amount of compensation. This yields a damping factor that approaches infinity.

Capacitor 82 is used to defeat the effects of the positive feedback network at high frequencies thereby eliminating any potential amplifier instability. A capacitor 82 value of 470 pf removes the positive feedback above frequencies of about 10 KHz. This is not a performance concession, because damping factor is only critical at mid and low frequencies.

Sampling across the output return wire 34 to improve DF keeps the positive feedback gain values low, and does not result in instability problems. It is thus possible with the present invention to achieve practical damping factors of 1000 or more.

Figure 3:
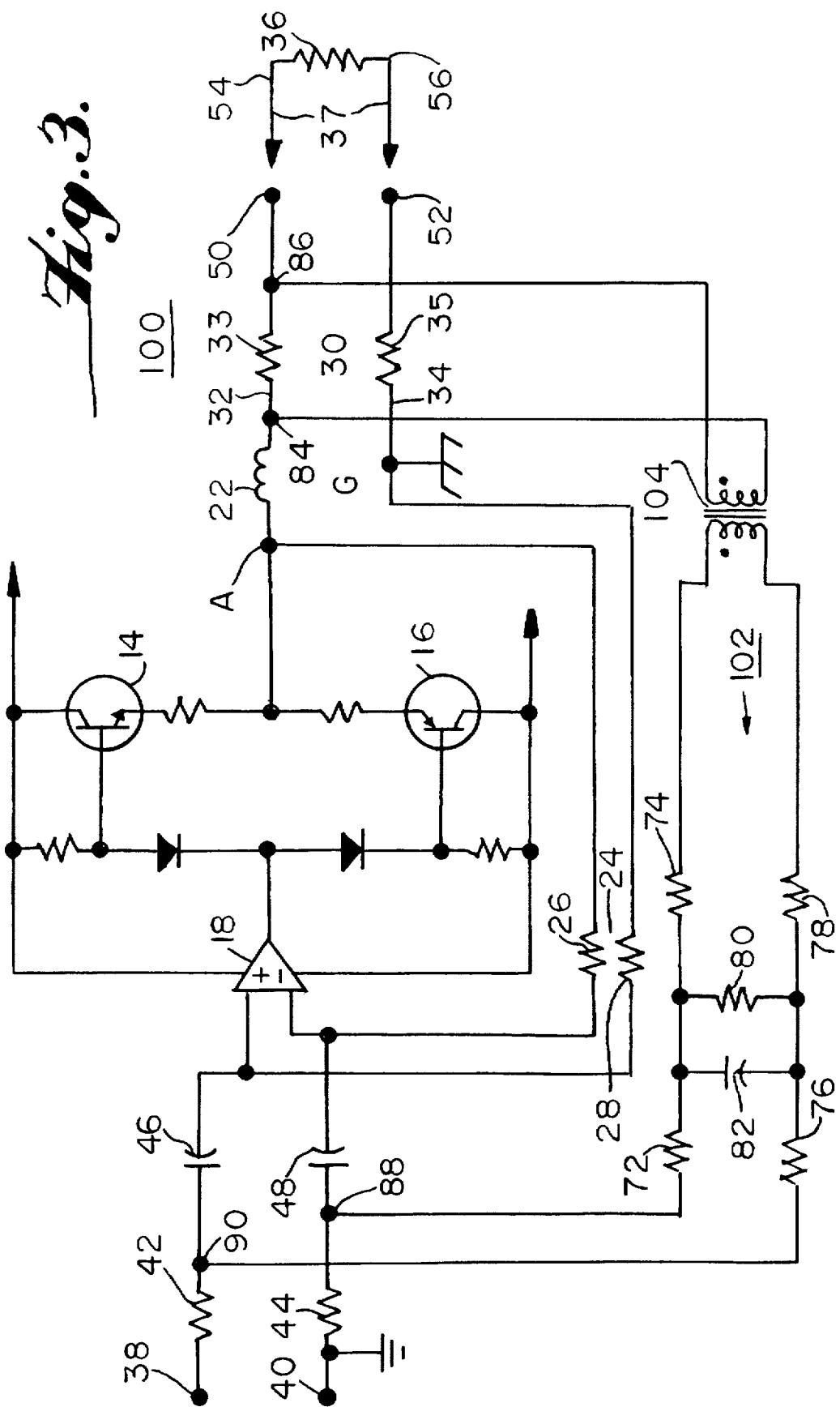
FIG. 3 is a schematic diagram of the power amplifier of FIG. 1 employing the damping factor enhancement in the output load feed according to the invention.

FIG. 3 shows an alternate embodiment of the invention wherein the same reference numerals are used for similar elements. In the arrangement shown, amplifier 100 has second balanced feedback circuit 24, including an isolation transformer 104 between the first and second inputs 84–86 and resistors 72–78. The isolation transformer 104 senses the voltage drop across the output load feed wire 32. One leg goes to the power amp internal output feed; the other leg goes to the output terminal 50. This voltage drop is added back using positive feedback to raise the output voltage at point A to compensate for the voltage losses in the coil 22 and all the wiring 30. The transformer 104 is employed to isolate the output voltage swing itself from the op amp 18 because it does not have enough common mode rejection capability to deal with the output voltage level. The added transformer 104 may be a one-to-one turns ratio which passes the sensing voltage through to the balanced circuitry 102. In this arrangement, the sensing is in the feed leg 32 rather than the return leg 34. Accordingly, the amplifier 100 may be connected in bridge mode without adversely affecting damping factor enhancement. Otherwise, this embodiment has the same performance as the arrangement of FIG. 2.

The transformer polarity is selected so that the signal is positively fed back. The isolating transformer 104 may be provided in the return lead if desired. Also, the resistor 80 may be varied to precisely adjust DF.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed:

1. A circuit for increasing damping factor in an audio amplifier comprising:

an amplifier having inverting and non-inverting inputs, and adapted to be coupled to a load by internal output feed and return leads coupled to corresponding output terminals and components having an impedance causing a reduction in the damping factor;

a balanced feedback network having first and second feedback inputs and first and second feedback outputs, the first feedback input being coupled to a selected one of the output feed lead and return lead near the corresponding output terminal thereof and the second feedback input being coupled to the same selected internal output lead remote from said terminal to thereby establish a series impedance between said first and second feedback inputs representative of impedance of the selected internal output; and the first feedback output being coupled to the non-inverting input of the amplifier and the second feedback output being coupled to the inverting input of the amplifier, said balanced feedback network positively feeding back a representation of the impedance to compensate therefor and thereby raise the damping factor of the amplifier.

2. The circuit of claim 1 wherein the balanced feedback network comprises resistors in each leg of the network between the first input and first output and the second input and second output and at least one frequency responsive element coupled between the series resistors between the legs.

3. The circuit of claim 2 wherein the frequency responsive element comprises a capacitor.

4. The circuit of claim 2 wherein the frequency responsive element comprises a capacitor and resistor in parallel.

5. The circuit of claim 2 wherein the balanced feedback network comprises a transformer coupled to the feedback inputs and the resistors.

6. The circuit of claim 1 wherein the balanced feedback network comprises a pair of series resistors in each leg of the network, and a frequency responsive element coupled to a node between said pairs of resistors.

7. The circuit of claim 1 wherein the amplifier includes internal output terminals and a further balanced feedback network coupled between the output feed and return leads of the amplifier and the respective inverting and non-inverting inputs of the amplifier.

8. The circuit of claim 7 wherein the further balanced feedback network comprises: a first resistor connected between the output feed lead remote from the corresponding output terminal and the non-inverting input of the amplifier; and a second resistor coupled between the return lead remote from the corresponding output terminal and the inverting input of the amp.

9. The circuit of claim 8 wherein the first and second resistors have an equal value.

10. The circuit of claim 1 wherein the return lead remote from the output terminal is an internal ground.

* * * * *